US009674981B1

(12) United States Patent
Cox et al.

(10) Patent No.: US 9,674,981 B1
(45) Date of Patent: Jun. 6, 2017

(54) RACK SIDECAR FOR ADDITIONAL IT EQUIPMENT AND CABLE MANAGEMENT

(71) Applicant: International Business Machines Corporation, Armonk, NY (US)

(72) Inventors: Aaron R. Cox, Tucson, AZ (US); Jason E. Minyard, Phoenix, AZ (US); Camillo Sassano, Durham, NC (US); Kevin L. Schultz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/051,797

(22) Filed: Feb. 24, 2016

Related U.S. Application Data (63) Continuation of application No. 14/957,656, filed on Dec. 3, 2015.

(51) Int. Cl.
*H05K 7/14* (2006.01)

(52) U.S. Cl.
CPC .................. *H05K 7/1491* (2013.01)

(58) Field of Classification Search
CPC . G06F 1/181; H05K 7/18; H05K 7/14; H05K 7/1488; H05K 7/1491; H05K 7/1492; H05K 7/1489
USPC ........... 312/257.1, 265.1, 265.4, 199; 211/26
See application file for complete search history.

(56) References Cited

U.S. PATENT DOCUMENTS

| | | | |
|---|---|---|---|
| 8,259,449 B2 | 9/2012 | Novotny et al. | |
| 8,879,247 B2 | 11/2014 | Archibald et al. | |
| 2005/0225936 A1* | 10/2005 | Day | H05K 7/20745 361/679.47 |
| 2008/0037228 A1 | 2/2008 | Lewis, II | |
| 2009/0086428 A1 | 4/2009 | Campbell et al. | |
| 2009/0147944 A1* | 6/2009 | McSorley | H05K 7/186 379/454 |
| 2011/0115345 A1* | 5/2011 | Kang | H02B 1/308 312/205 |
| 2012/0273438 A1* | 11/2012 | Nordin | H04Q 1/025 211/26 |
| 2013/0342091 A1* | 12/2013 | Walker | H05K 5/0247 312/265.5 |

(Continued)

FOREIGN PATENT DOCUMENTS

DE 2440101 A1 2/1975

OTHER PUBLICATIONS

U.S. Pending U.S. Appl. No. 14/957,656, filed Dec. 3, 2015, entitled: "Rack Sidecar for Additional it Equipment and Cable Management", pp. 1-19.

(Continued)

*Primary Examiner* — James O Hansen
(74) *Attorney, Agent, or Firm* — Samuel A. Waldbaum (57) ABSTRACT

A structure of a server rack and sidecar combination. The structure may include; a server rack having an opening and a server door on a front side of the server rack; a sidecar mounted to a side of the server rack, the sidecar has an access area on a front side of the sidecar, wherein the server rack opening and the access area are accessible form a common side; an adapter mounted to the accessible common side, wherein the adapter does not restrict access to the server rack opening and the access area, the adapter has at least three vertical sides; and a cable management bar located within the at least three vertical sides.

1 Claim, 6 Drawing Sheets (56) References Cited

U.S. PATENT DOCUMENTS

2015/0169012 A1   6/2015   Saez et al.

OTHER PUBLICATIONS

IBM: List of IBM Patents or Patent Applications Treated as Related (Appendix P), Dec. 16, 2016, pp. 1-2.

* cited by examiner

ROUND HOLES

Fig. 3

SQUARE HOLES

RACK SIDECAR FOR ADDITIONAL IT EQUIPMENT AND CABLE MANAGEMENT

BACKGROUND

The present invention generally relates to server rack design and configuration, and more particularly to a server rack sidecar extension for IT or TELCO (telecommunication) equipment and cable management.

Current server rack trends utilize 600 mm wide enclosures. The typical narrow form factor leaves limited space for Power Distribution Units (PDUs). In most cases, these narrower racks require PDUs to be placed in a pocket inside the sidewalls, but are not installable or serviceable without removing side panels or equipment. Similarly, there is limited space for cable routing from sides or top to bottom along EIA rails.

SUMMARY

According to one embodiment of the present invention, a server rack and sidecar combination is provided. The structure may include a server rack includes a rear, two sidewalls, and a front having an opening, a server door on a front side, and a rack mount fixture located in the front and rear of the server rack, wherein each of the mounting fixtures consisting of two vertical parallel strips, and wherein the server door is adjustable. A sidecar mounted to one of the sidewalls of the server rack, the sidecar having an access area on a front side, wherein the server rack opening and the access area are accessible from a common side. An adapter having a triangular profile is mounted to a top and a bottom of the front of the server rack and the sidecar, wherein each angle of the triangle is different. A cable management bar that extends vertically between the adaptor mounted at the top of the front of the server rack and the sidecar and the adaptor mounted at the bottom of front of the server rack and the sidecar. Wherein the adapter comprises; a first connecting surface that extends along the front surface of the server rack and the side car; a second connecting surface that forms one side of the triangular profile of the adaptor that extends from a hinge that connects the server door to the server rack, wherein where the first connecting surface extending from a hinge that connects to server door to the server rack forms the smallest angle of the triangular profile of the adapter; a third connecting surface that forms one side of the triangular profile of the adaptor that extends from a hinge that connects a sidecar door to the sidecar. Wherein the cable management bar is enclosed by the server door the secondary door in the closed position, and the cable management bar is accessible when the server door the secondary door are in the open position. Wherein when the server door is in a closed position it comes into contact with the second connecting surface of each of the adaptors, and wherein when the sidecar door is in a closed position it comes into contact with the third connecting surface of each of the adaptors.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to server rack design and configuration, and more particularly to a server rack sidecar extension for IT or TELCO (telecommunication) equipment and cable management. Ideally, each part of a rack (e.g., servers, cables, PDUs, etc) will be accessible without the need for disassembly of a portion of the rack or components within the rack. One way to design a rack layout to allow for access to each component of the rack is to create a sidecar to house elements not easily accessible in today's racks and to provide an additional means of cable management. One embodiment by which to form a sidecar is described in detail below referring to the accompanying drawings FIGS. 1-7.

Figure 1:
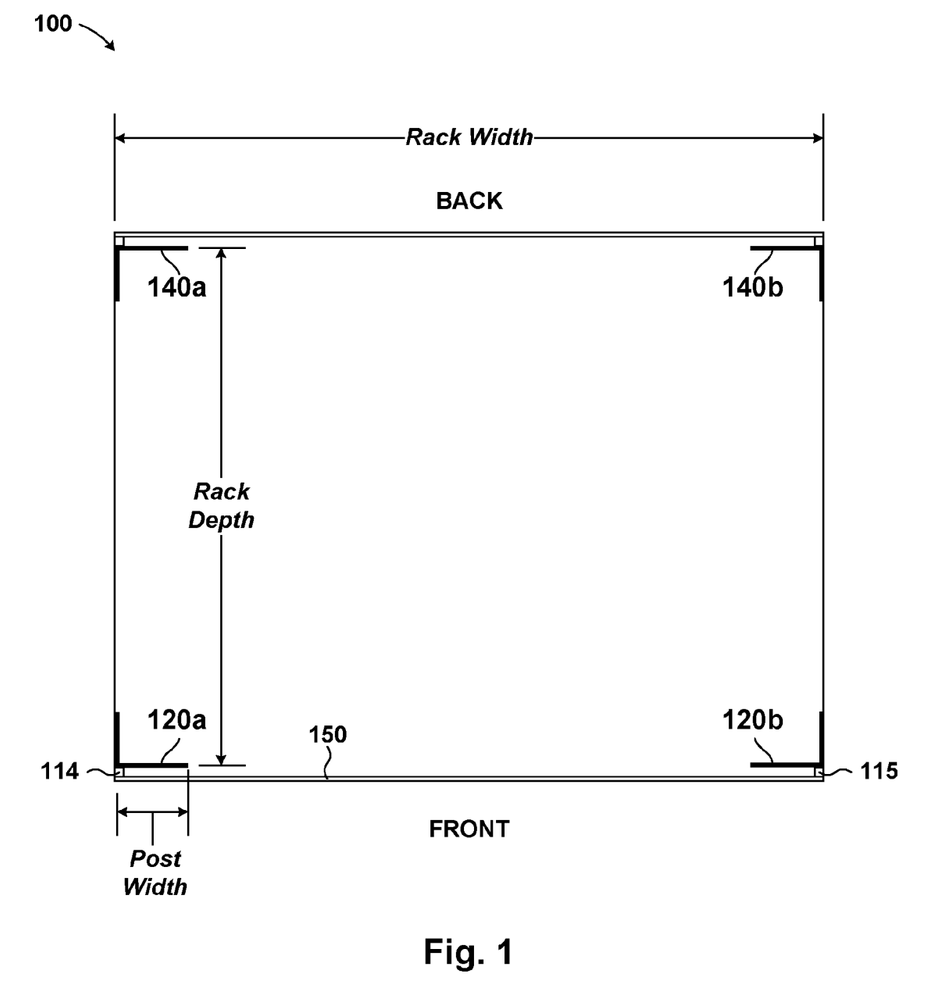
FIG. 1 is a top view of a server rack, according to an exemplary embodiment.
Figure 2:
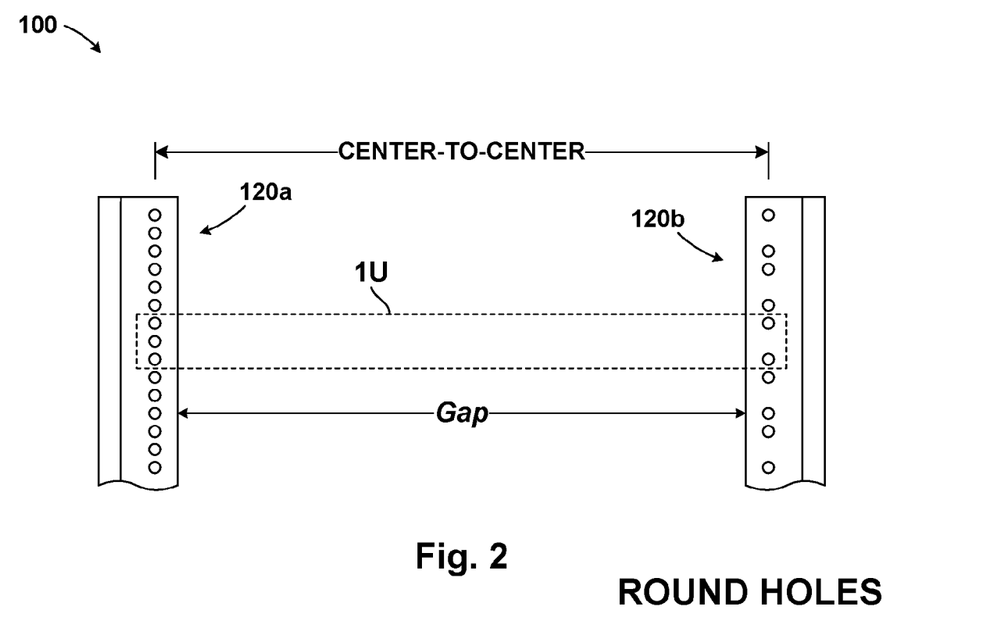
FIG. 2 is a front view of the server rack, according to an exemplary embodiment.
Figure 3:
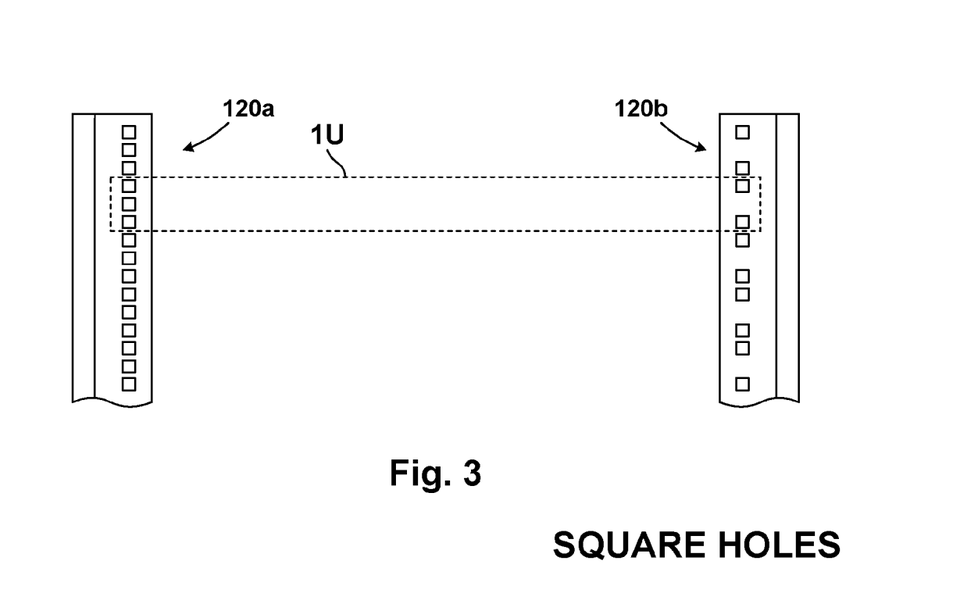
FIG. 3 is a front view of the server rack, according to an exemplary embodiment.

Referring now to FIGS. 1-3, a top view (FIG. 1) and two front views (FIGS. 2 and 3) of a server rack 100 are illustrated, according to an embodiment. More specifically, typical features and dimensions of a server rack are discussed.

Typically, a 19-inch rack is a standard structure for mounting one or more equipment modules, such as servers and systems. Each module has a front panel that is 19 inches wide, including edges or ears that protrude on each side which allow the module to be fastened to the rack frame. 19-inch racks hold most equipment in modern data centers, ISP facilities, and professionally designed corporate server rooms. Typically, a piece of equipment being installed has a front panel height $\frac{1}{32}$ inch (0.031 inches or 0.787 millimeters) less than the allotted number of rack units (U's). Such that, a 1 U rack mount computer is not 1.75 inches (44.4 mm) tall but is 1.719 inches (43.7 mm) tall. 2 U would be 3.469 inches (88.1 mm) instead of 3.5 inches (88.9 mm). This gap allows a bit of room above and below an installed piece of equipment so it may be removed without binding on the adjacent equipment.

A rack's front mounting fixture consists of two parallel metal strips (also referred to as "posts" or "panel mounts") standing vertically, illustrated as front posts 120a, 120b in the figures. The posts each have a post width of about 0.625 inches (15.88 mm), and are separated by an internal rack width of 17.75 inches (450.85 mm), giving an overall rack width of 19 inches (482.60 mm). The server rack 100 has two back posts 140a, 140b with a gap similar to the front posts. The front posts 120a, 120b and back posts 140a, 140b are separated by a rack depth.

FIG. 2 illustrates a rack with round holes and FIG. 3 illustrates a rack with square holes (two typical types of mounting designs). The posts have holes at regular intervals, with both posts matching, so that each hole is part of a horizontal pair with a center-to-center distance of 18.312 inches (465.12 mm). The post holes may come in different shapes and sizes, such as, for example, threaded holes for #12-24 or #10-32 screws, tapped holes, or square holes. A server door 150 can cover the front and/or back of the rack. The server door 150 can be attached to the server via a hinge 114 on one side and a latch 115 on an opposing side.

Figure 4:
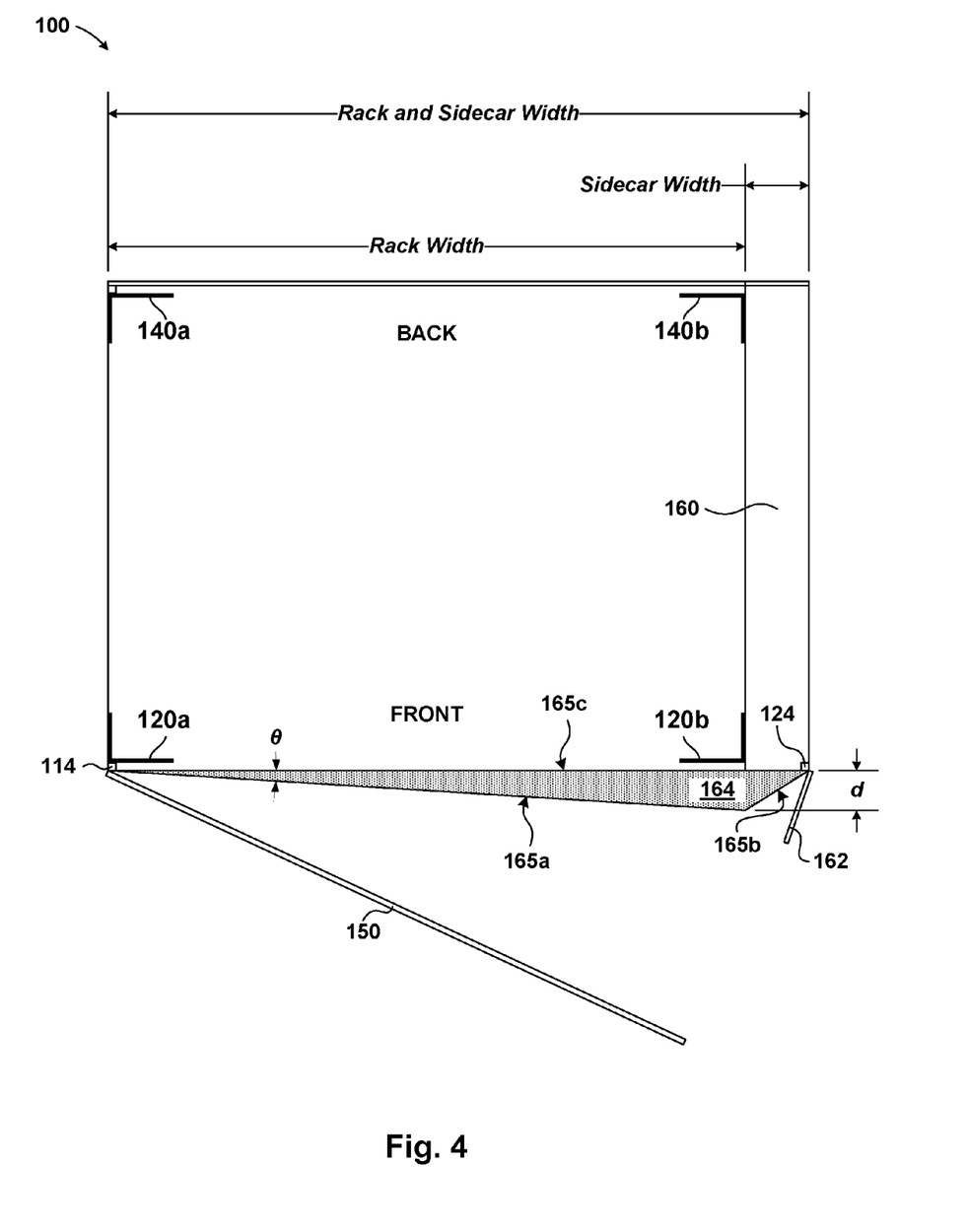
FIG. 4 is a top view of the server rack and sidecar combination having an adaptor, a server door, and a secondary door, according to an exemplary embodiment.
Figure 5:
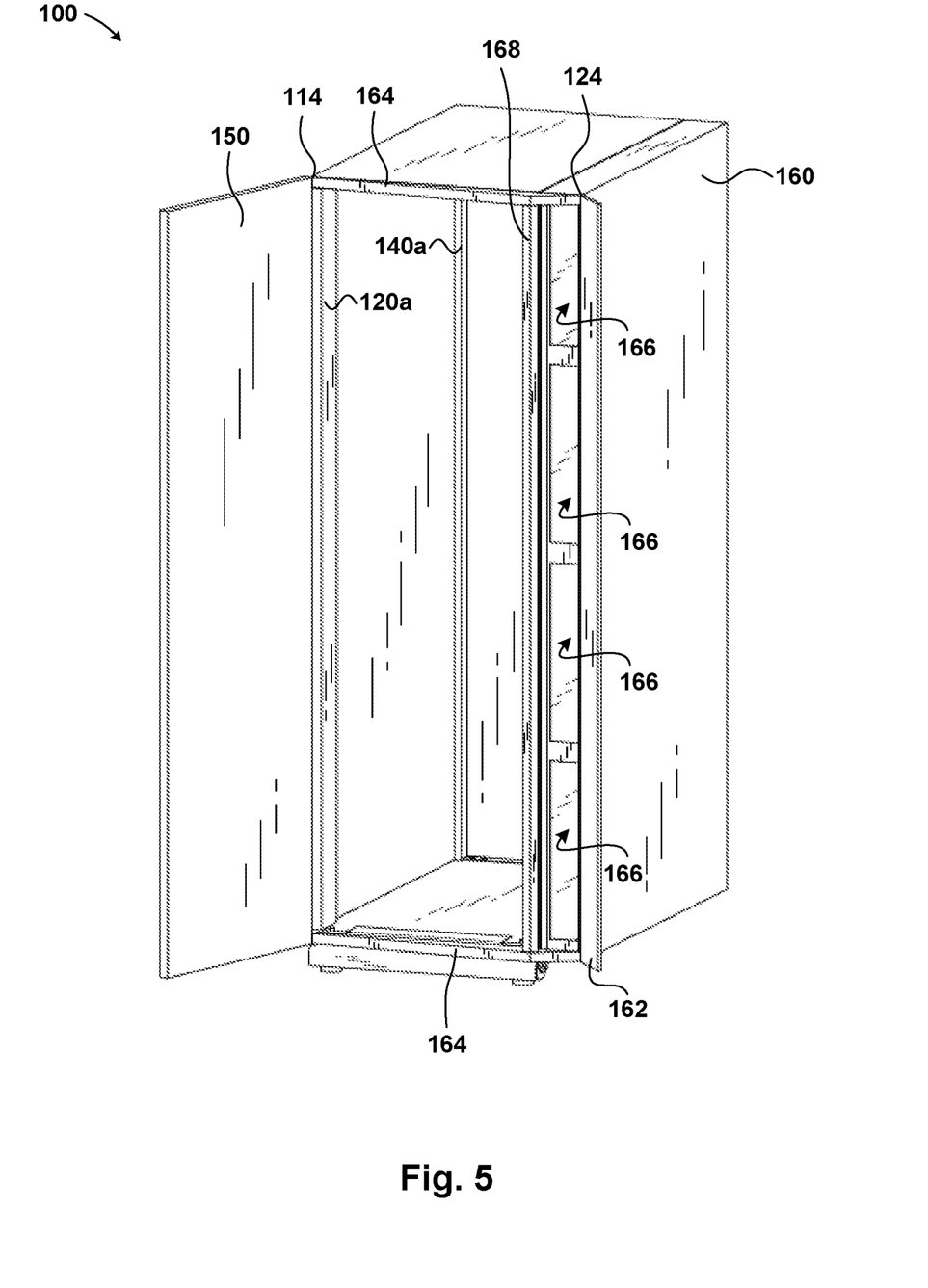
FIG. 5 is an isometric view of the server rack and sidecar combination having an adaptor, a server door, and a secondary door, according to an exemplary embodiment.
Figure 6:
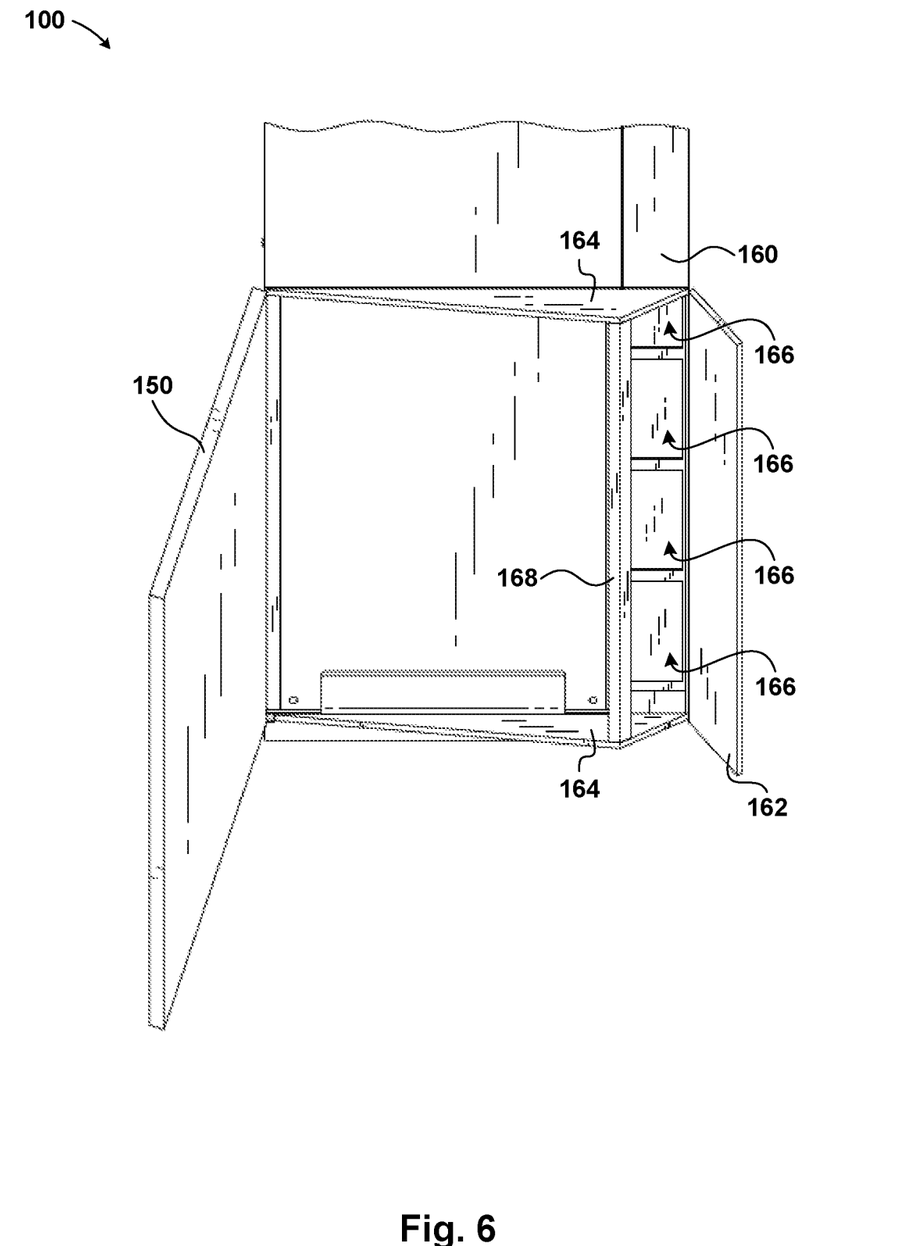
FIG. 6 is an isometric view of the server rack and sidecar combination having an adaptor, a server door, and a secondary door, according to an exemplary embodiment.

Referring now to FIGS. 4-6, a top view (FIG. 4) and two isometric views (FIGS. 5 and 6) of the server rack 100 having a sidecar 160 and an adapter 164 are illustrated, according to an embodiment. More specifically, features and dimensions of the sidecar 160 and the adapter 164 are discussed.

Typical server rack configurations include mounting systems (e.g., servers) to the front of the rack for easy access and maintenance, however, other commonly used equipment (e.g., Power Distribution Units (PDUs)) are placed in inside wall pockets which are not directly accessible without the removal of the mounted or removable systems. Similarly, there is limited space for cable routing from top to bottom of rack or vice versa, along the EIA rails. This has become even more difficult as more systems including storage, server and networking have need for front of rack cabling.

The sidecar 160 includes storage area for additional server rack equipment, such as, for example, systems, PDUs, cables, or any other server equipment know in the art. The sidecar 160 can have one or more access areas 166 for storing the additional equipment. The access areas 166 can be accessed from a front side of the sidecar 160. The sidecar 160 can be used in conjunction with the server rack 100 by mounting the sidecar 160 to a side of the server rack 100, such that the server rack 100 and the sidecar 160 share a common access side (e.g., the access areas 166 can be accessed from the same side as the front side of the server rack 100). The sidecar 160 can be fastened to a side of the server rack 100 using the server rack mounting holes (e.g., the holes in the front and back posts 120a, 120b and/or the back posts 140a, 140b); however, any other connecting technique may be used, such as, for example, bolting or welding. The sidecar 160 can have a height and depth substantially similar to the height and depth of the server rack 100.

Figure 7:
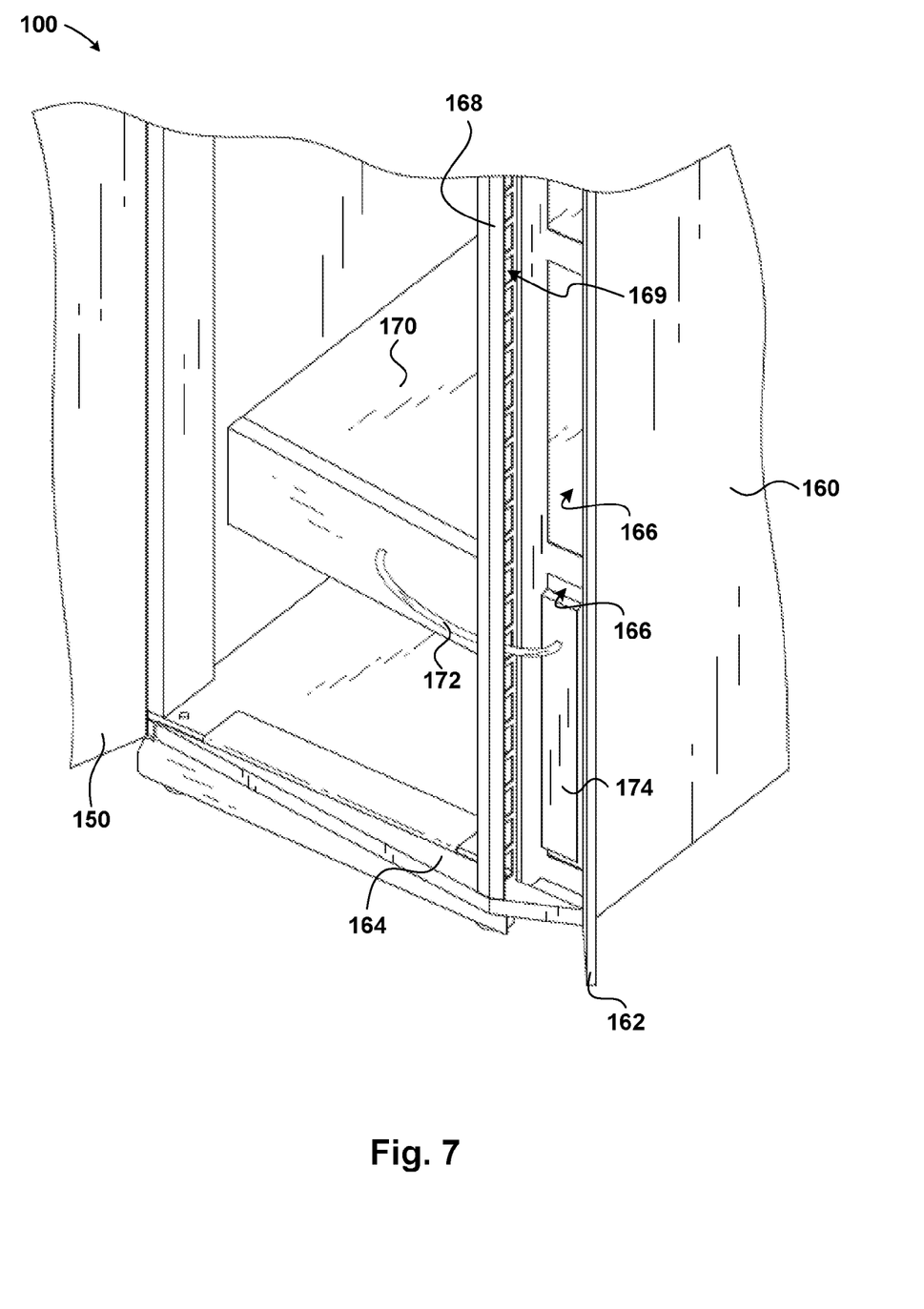
FIG. 7 is an isometric view of the server rack and sidecar combination with equipment and connecting cables installed within the server rack and sidecar, according to an exemplary embodiment.

As will be further described in reference to FIG. 7, equipment mounted in the server rack 100 may have cables connecting to equipment mounted in the sidecar 160. As one possible means to have quick and easy access to the connecting cables, without the need to remove any equipment, an adapter 164 may be used in such a way that allows the cables to extend out from the front of the server rack 100 around the adjacent sides of the server rack 100 and the sidecar 160 and into the access areas 166. In a configuration that has the cables protruding from the server rack 100 and extending to the sidecar 160, the server door 150 will no longer be able to fully close. The adapter 164 can create room for the connecting cables while still allowing for the equipment in the server rack 100 and the sidecar 160 to be fully enclosed. With the additional area needed to account for protruding cables described above, the adapter 164 may extend out a distance (d) from the front of the server rack 100.

The adapter 164 may have, for example, a triangular profile with three vertical surfaces including; a connecting surface 165c, a server door surface 165a, and a secondary surface 165b. The connecting surface 165c may be a surface that abuts the front of the server rack 100 and the front of the sidecar 160. The connecting surface 165c can have a surface height substantially similar to the height of the server rack 100 and a surface width substantially similar to a rack and sidecar width (e.g., the rack width plus the sidecar width). The server door surface 165a may intersect the connecting surface 165c at a side of the server rack 100 opposite the sidecar 160. The server door surface 165a may extend from the side of the server rack 100 opposite the sidecar 160 at an angle (θ) from the connecting surface 165c. The intersecting line between the connecting surface 165c and the server door surface 165a can be at hinge 114. The server door surface 165a may have a surface height and width that is substantially similar to the height and width of the server door 150. The server door 150 can rotate about the hinge 114 from an open position to a closed position. The closed position is where the server door 150 is abutting the server door surface 165a and the open position can by any other position. The server door surface 165a may extend from the hinge 114 to an intersection with the secondary surface 165b. The intersection between the server door surface 165a and the secondary surface 165b may be at the distance (d) from the connecting surface 165c. The secondary surface 165b may extend from the intersection with the server door surface 165a to the connecting surface 165c (i.e., forming the triangular profile).

The adapter 164 can be mounted to the mounting holes in the server rack 100 and/or the sidecar 160. The adapter 164 may have a top portion and bottom portion and may have a server rack opening and a sidecar opening that allows for access to the server rack 100 and the sidecar 160. A cable management bar 168 may be used to organize the connecting cables between the server rack 100 and the sidecar 160. The cable management bar 168 may be coplanar with the abutting sides of the server rack 100 and the sidecar 160 and may extend out perpendicularly to about distance (d).

The original server door 150 may be used after the addition of the adapter 164, such that the server door 150 rotates about the hinge 114 between the open position and the closed position. When the server door 150 is in the closed position, an opening may still be present along the secondary surface 165b exposing the inside of the server rack 100 and sidecar 160. To fully enclose the server rack 100 and sidecar 160, a secondary door 162 may be used to cover the opening along the secondary surface 165b. The secondary door 162 may rotate about hinge 124 between an open position and the closed position. The closed position for the secondary door 162 may be when the secondary door 162 is abutting the secondary surface 165b and the open position may be any other position.

When the sever door 150 and the secondary door 162 are both in the closed position, the sever door 150 and the secondary door 162 may be latched using any latching means known in the art, such as, for example, mechanical or magnetic latching means. The latching means may be between the adapter 164, the server door 150, the secondary door 162, or any other part of the structure.

Referring now to FIG. 7, an isometric view of the server rack 100 having a sidecar 160 and adapter 164 is illustrated, according to an embodiment. More specifically, an exemplary embodiment illustrates a possible configuration for equipment in the server rack 100 and sidecar 160.

A system 170 may be mounted in the server rack 100 using the mounting holes (illustrated in FIGS. 1 and 2). The system 170 may be, for example, a server. A system 174 may be mounted in one of the access areas 166 in the sidecar 160. The system 174 may be, for example, a PDU. Connecting cables 172 may connect system 170 and system 174 and may be organized by running through openings 169 in the cable management bar 168. As additional systems are added to the server rack 100 and the sidecar 160 additional cables may need to run from one area to another. The additional cables may also be organized using the cable management bar 168.

One benefit of having a sidecar 160 is that systems that are typically not easily accessible in a server rack (e.g., PDUs), may now be directly accessible from the front of the final structure (i.e., the server rack 100 and the sidecar 160). Additionally, connecting cables between systems are also now accessible without the need to remove equipment and may be easily organized using the cable management bar 168.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure of a server rack and sidecar comprising:
   a server rack includes a rear, two sidewalls, and a front having an opening, a server door on a front side, and a rack mount fixture located in the front and rear of the server rack, wherein each of the mount fixtures consisting of two vertical parallel strips, and wherein the server door is adjustable;
   a sidecar mounted to one of the sidewalls of the server rack, the sidecar having an access area on a front side, wherein the server rack opening and the access area are accessible from a common side;
   an adapter having a triangular profile is mounted to a top and a bottom of the front of the server rack and the sidecar, wherein each angle of the triangular profile is different; and
   a cable management bar that extends vertically between the adapter mounted at the top of the front of the server rack and the sidecar and the adapter mounted at the bottom of the front of the server rack and the sidecar;
   wherein the adapter comprises;
      a first connecting surface that extends along a front surface of the server rack and the sidecar;
      a second connecting surface that forms one side of the triangular profile of the adapter that extends from a hinge that connects the server door to the server rack, wherein where the first connecting surface extending from the hinge that connects the server door to the server rack forms the smallest angle of the triangular profile of the adapter;
      a third connecting surface that forms one side of the triangular profile of the adapter that extends from a hinge that connects a secondary door to the sidecar;
   wherein the cable management bar is enclosed by the server door and the secondary door in a closed position, and the cable management bar is accessible when the server door and the secondary door are in an open position;
   wherein when the server door is in the closed position the server door comes into contact with the second connecting surface of each of the adapters; and
   wherein when the secondary door is in the closed position the secondary door comes into contact with the third connecting surface of each of the adapters.

* * * * *